United States Patent [19] [11] Patent Number: 5,985,687
Bowers et al. [45] Date of Patent: Nov. 16, 1999

[54] METHOD FOR MAKING CLEAVED FACETS FOR LASERS FABRICATED WITH GALLIUM NITRIDE AND OTHER NONCUBIC MATERIALS

[75] Inventors: John E. Bowers, Santa Barbara; R. Kehl Sink; Steven P. Denbaars, both of Goleta, all of Calif.

[73] Assignee: The Regents of the University of California, Oakland, Calif.

[21] Appl. No.: 08/630,675

[22] Filed: Apr. 12, 1996

[51] Int. Cl.⁶ .................................................. H01L 21/00
[52] U.S. Cl. .............................. 438/46; 438/29; 438/33; 438/68; 438/455; 438/458; 438/459; 438/967; 438/977; 438/464; 438/93; 438/94
[58] Field of Search .................................. 438/29, 33, 46, 438/68, 455, 458, 459, 967, 971, 464, 93, 94, FOR 289, FOR 294, FOR 334, FOR 386, FOR 445, FOR 485; 148/DIG. 12, DIG. 13, DIG. 28, DIG. 95, DIG. 110, DIG. 113, DIG. 135, DIG. 72, DIG. 97; 372/45, 46, 47

[56] References Cited

U.S. PATENT DOCUMENTS

| 4,445,965 | 5/1984 | Milnes . |
| 4,692,207 | 9/1987 | Bouadma et al. . |
| 4,769,342 | 9/1988 | Yagi et al. . |
| 4,855,249 | 8/1989 | Akasaki et al. . |
| 5,157,679 | 10/1992 | Kondow et al. . |
| 5,173,751 | 12/1992 | Ota et al. . |
| 5,180,463 | 1/1993 | Le Moigne et al. . |
| 5,198,069 | 3/1993 | Zimmerman et al. . |
| 5,198,686 | 3/1993 | Yoshimura . |
| 5,272,114 | 12/1993 | van Berkum et al. . |
| 5,284,792 | 2/1994 | Forster et al. . |
| 5,321,713 | 6/1994 | Khan et al. . |
| 5,366,924 | 11/1994 | Easter et al. . |
| 5,393,711 | 2/1995 | Biallas et al. . |
| 5,602,418 | 2/1997 | Imai et al. .............................. 257/627 |
| 5,780,873 | 7/1998 | Itaya et al. .............................. 257/521 |
| 5,814,532 | 9/1998 | Ichihara .................................... 438/33 |

OTHER PUBLICATIONS

R. K. Sink, et al., "Cleaved GaN Facets by Wafer Fusion of GaN to InP", Appl. Phys. Lett., 68 (15), Apr. 8, 1996.
Keller, B. P., "Effect of Atmospheric Pressure MOCVD Growth Conditions on UV Band–Edge Photoluminescene in GaN Thin Films", vol. 31, No. 13, Jun. 1995.
Stocker, D., "Optically pumped InGaN/GaN Double Heterostructure Lasers With Cleaved Facets", Elect. Lett., Dec. 1997.
Ping, A. T., "Study of Chemically Assisted Ion Beam Etching of GaN Using HCl Gas", Appl. Phys. Lett., 67 (9), Aug. 1995.

*Primary Examiner*—Wael M. Fahmy
*Assistant Examiner*—Long Pham
*Attorney, Agent, or Firm*—Daniel L. Dawes

[57] ABSTRACT

Optically flat cleaved facet mirrors are fabricated in GaN epitaxial films grown on sapphire by wafer fusing a GaN film with a sapphire substrate to a cubic substrate such as an InP or GaAs substrate. The sapphire substrate may then partially or entirely removed by lapping, dry etching, or wet etching away a sacrificial layer disposed in the interface between the sapphire substrate and the GaN layer. Thereafter, the cubic InP or GaN substrate is cleaved to produce the cubic crystal facet parallel to the GaN layer in which active devices are fabricated for use in lasers, photodetectors, light emitting diodes and other optoelectronic devices.

31 Claims, 6 Drawing Sheets

METHOD FOR MAKING CLEAVED FACETS FOR LASERS FABRICATED WITH GALLIUM NITRIDE AND OTHER NONCUBIC MATERIALS

This invention was made with Government support under Grant No. DMR-9223048, awarded by the National Science Foundation. The Government has certain rights in this invention.

BACKGROUND OF THE INVENTION

1. Field of the Invention

The invention relates to the field of solid state lasers and in particular to semiconductor lasers fabricated in noncubic materials such as GaN.

2. Description of the Prior Art

Metallic nitride in-plane lasers, such as indium nitride, GaN or aluminum nitride lasers, operating in the 300 to 700 nm range are potentially attractive devices for visible light applications and for high density data storage systems. Blue, green, and yellow high brightness, light emitting diodes (LED) have been fabricated. Recently, electrically pumped lasers have been demonstrated. Optically pumped GaN lasers have been made with high thresholds in the range of 100 to 800 kW/cm$^2$ operating at room temperature. To reduce the lasing threshold, however, it is necessary that the mirrors in the lasers be improved. The most promising types of mirrors for use in an in-plane device are an etched distributed Bragg reflector mirror (DBR) and etched facet mirrors. However, the fabrication of both of these mirror types is difficult. First, it is difficult to create facets with reactive ion etching that are both smooth and perpendicular to the wafer surface. Second, reactive ion etching causes surface damage in GaN which is a problem for the performance of both DBR mirrors and etched facet mirrors.

Another possible type of mirror which could be chosen for GaN based lasers is a mirror made from a cleaved facet. With the application of high reflectivity coatings, cleaved facet mirrors are expected to provide comparable reflectivities to etched mirrors. Cleaved facet mirrors have been fabricated for GaAs grown on silicon carbide. See A. T. Ping et al., Appl. Phys. Lett. 67,1250(1995) However, cleaved mirrors have not been fabricated for GaN grown on sapphire because the cleavage planes of (0001) sapphire substrates are not perpendicular to the wafer surface.

Therefore, what is needed is a method for obtaining cleaved facet mirrors for GaN films grown on GaN, sapphire or other noncubic materials.

BRIEF SUMMARY OF THE INVENTION

The invention is a method for fabricating a cleaved facet along a cubic plane in a layer of noncubic material, such as a metallic nitride, which is epitaxially grown on a noncubic substrate, comprising the steps of epitaxially growing the noncubic material or metallic nitride layer on the noncubic substrate and wafer fusing the epitaxially grown noncubic material or metallic nitride layer to a second substrate comprised of cubic material. At least part of the noncubic substrate may be removed, and the cubic substrate is cleaved along a cubic plane. As a result, an optically flat cubic reflecting plane is fabricated perpendicular to the layer epitaxially grown on the noncubic substrate.

In the illustrated embodiment epitaxially growing the layer on the noncubic substrate comprises epitaxially growing GaN on sapphire. Fusing the cubic material comprises fusing either a GaAs or InP substrate to the epitaxially grown GaN layer.

In one embodiment removing at least part of the noncubic substrate comprises lapping the noncubic substrate to a predetermined thinness. In another embodiment removing at least part of the noncubic substrate comprises dry etching the noncubic substrate. In a third embodiment, the substrate is etched down to a stop etch layer. In still a further embodiment the method further comprises disposing a sacrificial layer on the noncubic substrate prior to epitaxially growing the layer thereon and removing at least part of the noncubic substrate by wet etching away the sacrificial layer.

Expitaxially growing the layer on the noncubic substrate may comprise first epitaxially growing a buffer layer on the noncubic substrate and then epitaxially growing device layers on the noncubic substrate. For example, epitaxially growing the buffer and device layer comprises epitaxially growing a GaN buffer and device layers on a sapphire substrate.

The method further comprises epitaxially growing a fusion layer on the device layers, such as an InN or GaN fusion layer buffer on a sapphire substrate. The method contemplates further epitaxially growing a fusion layer on the device layers.

The invention is also characterized as an improvement in a method for fabricating mirror facets in a laser comprising the steps of epitaxially growing an active device layer on sapphire and wafer fusing the epitaxially grown active device layer to an oriented cubic crystal substrate to provide a fused structure. At least a portion of the sapphire may be removed from the fused structure. The fused structure is cleaved to obtain a cubic cleavage plane. As a result, an optically flat mirror surface for the laser is obtained. The sapphire substrate is thinned prior to cleaving the fused structure to reduce the influence of sapphire bond strength on the cleaved facet.

The improvement includes first epitaxially growing a nucleation layer at a first temperature and thereafter growing a thicker active device layer at a second higher temperature. The process may further comprise defining a plurality of channels in the oriented cubic crystal substrate prior to fusing to permit fluid escape from the interface defined in the fused structure between the active device layer and the oriented cubic crystal substrate during fusing of the active device layer and oriented cubic crystal substrate.

The invention is also a method for fabricating a p-type electrical contact on a layer of metallic nitride comprising the steps of disposing the metallic nitride layer on a first substrate, disposing a p-type fusion layer on a second substrate, and fusing the metallic nitride to the p-type fusion layer on the second substrate. At least part of the second substrate may be removed to form an opening for an electrical contact to the metallic nitride layer. An electrical contact is then formed in the opening. As a result, a reduced resistance contact is provided to the metallic nitride layer. The metallic nitride layer is disposed on the first substrate by epitaxially growing the metallic nitride layer on the first substrate. For example, epitaxially growing the metallic nitride layer on the first substrate comprises epitaxially growing p-type GaN on a sapphire substrate. Disposing a p-type fusion layer on a second substrate comprises disposing a p-type InGaAs layer on an InP substrate. The step of disposing a p-type InGaAs layer on an p-type substrate may further comprise disposing a p-type InP fusion layer between the p-type InGaAs layer and the p-type GaN layer. Alternatively, the step of disposing a p-type fusion layer on a second substrate may comprise disposing a p-type AlGaAs fusion layer on the second substrate and disposing the metallic nitride layer on a first substrate may comprise disposing a p-type GaN layer on the first substrate.

The invention is yet further defined as a method for activating a p-type dopant in a metallic nitride comprising the steps of disposing a p-type doped metallic nitride layer on a first substrate, disposing a fusion layer on a second substrate, fusing the p-type doped metallic nitride to the fusion on the second substrate, and simultaneously annealing the p-type doped metallic nitride while fusing the p-type doped metallic nitride to the fusion on the second substrate to inhibit loss of nitrogen from the p-type doped metallic nitride while activating the p-type dopant in the p-type doped metallic nitride. As a result, increase p-type dopant activation is provided to the metallic nitride layer. The fusion layer on a second substrate may comprise a p-type doped fusion layer.

The invention and its various embodiments may now be better visualized by turning to the following Figures wherein like elements are referenced by like numerals.

Figure 1:
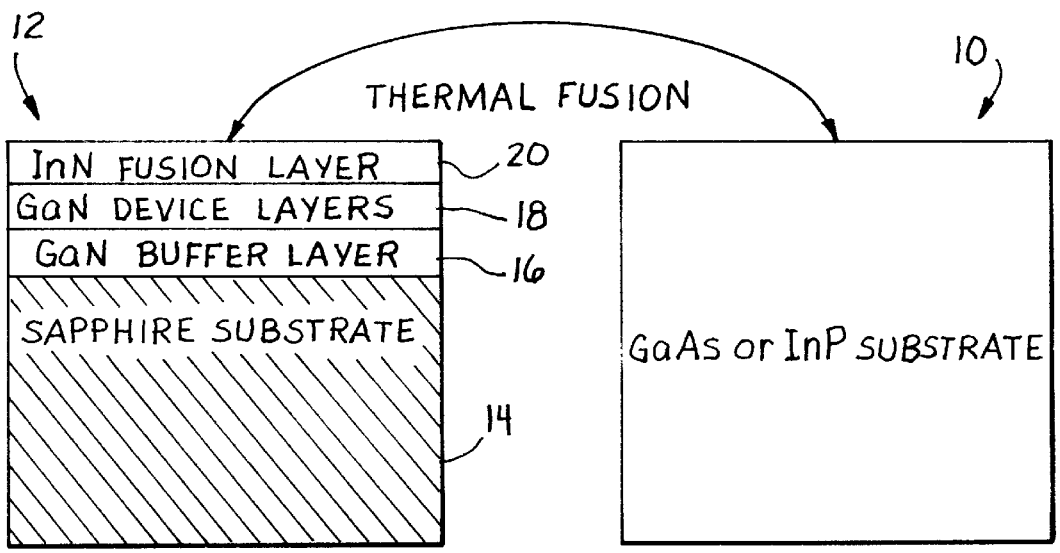
FIG. 1 is a simplified diagram illustrating the starting components for a thermal fusion process fusing GaN on sapphire to a GaAs or InP substrate.

The invention and its various embodiments may now be understood by turning to the following detailed description.

DETAILED DESCRIPTION OF THE PREFERRED EMBODIMENTS

Fabrication of in-plane lasers based on metallic nitride material systems, e.g. (In, Ga, Al) N, for operation in the 300–700 nm range will increase the density of data storage systems and will likely spawn a large number of visible light applications. High-density storage systems and visible display applications of this technology are expected to be extensive. Several problems in p type doping have yet to be solved in order to realize this display technology. Wafer fusion of GaN to InP, GaAs or another host substrate will provide a solution to many of these by providing; (1) cleaved mirrors for in-plane devices; (2) reduced p-type contact resistance; and (3) increase of p-type dopant activation. The robustness of GaN lasers in adverse environments, long lifetimes, durability, and broad spectral ranges offers many new applications.

Optically flat cleaved facet mirrors are fabricated in GaN epitaxial films grown on sapphire by wafer fusing a GaN film with a sapphire substrate to a cubic substrate such as an InP or GaN substrate. The sapphire substrate may then be partially or entirely removed by lapping, dry etching, wet etching, or more particularly wet etching away a sacrificial layer disposed in the interface between the sapphire substrate and the GaN layer. Thereafter, the cubic InP or GaN substrate is cleaved to produce the cubic crystal facet parallel to the GaN layer in which active devices are fabricated for use in lasers, photodetectors, light emitting diodes and other optoelectronic devices.

A layer of GaN is fused to a layer of InP without voids or oxide at the interface between the two. An optically flat cleaved GaN facet parallel to the crystallographic planes in the host InP substrate is then obtained. In the device of the invention the fused junction defined on the interface plane exhibits a barrier of several electron volts for electrons passing from the InP host into the GaN facet layer and exhibits ohmic conduction of electrons moving in the opposite direction. However, this is not inherent and with grading of the interface, low resistance, ohmic conduction in both directions is possible. The method of the invention is based on wafer fusion of (100) oriented InP substrate to epitaxial hexagonal GaN (h-GaN/α-Al$_2$O$_3$). Wafer fusion was first performed over a large area in 1991 by Liau and Mull. See Z. L. Liau et al., Appl. Phys. Letters 56, 737(1991). Since that time, wafer fusion has been used for many applications because of its simplicity and for the fact that it allows layer structures to be fabricated that cannot be achieved by traditional growth methods. For example, wafer fusion has been used to produce transparent substrate AlGaInP/GaP LED's as well as long wavelength vertical cavity surface emitting lasers, resonant cavity photodetectors and heterojunction avalanche photodetectors.

The advantage of the wafer fusion method is that it avoids those restrictions of material choices that arise from lattice mismatch, which are characteristic for heterojunctions grown by metal-organic-chemical-vapor deposition (MOCVD) or molecular beam epitaxy (BE). For both GaN vertical cavity surface emitting lasers and GaN in-plane lasers, the relaxation of these restrictions gives rise to an increased flexibility to choose materials based on optimal thermal and electrical characteristics.

In the simplest terms, the fusion process is comprised of (1) cleaning the two layers which are to be fused together with solvents; (2) pressing them together; (3) heating them under pressure. FIG. 1 is a diagrammatic cross-sectional view showing a first layer which is a GaAs or InP substrate 10 and a second multiple layered structure 12, which is comprised of a sapphire substrate 14 upon which has been disposed a GaN buffer layer 16, a GaN device layer 18. The native oxide on layers 10 and 12 is then removed with an acid, such as hydrofluoric acid. While layers 10 and 12 are still wet with the acid, they are pressed together as shown in FIG. 1 by 0.1 to 10 MPa of pressure and heated to approximately 750° C. for a predetermined time, such as 40 minutes or longer. The temperatures, pressures and times may be reduced and varied according to the process parameters chosen consistent with the teachings of the present invention. The result is a fused structure, generally denoted by reference numeral 22, shown in FIG. 2 in which structures 10 and 12 have been fused together at an interface across substrate 10.

In the preferred embodiment, sapphire layer 14 is then thinned to compensate for the stronger crystalline bonds in sapphire than in InP. Any method now known or later devised for thinning sapphire substrate 14 may be employed and in the illustrated embodiment, thinning of layer 14 may be achieved by lapping, dry etching or removal by wet etching a sacrificial layer such as a ZnO layer described below in connection with FIGS. 4a and b.

Figure 2:
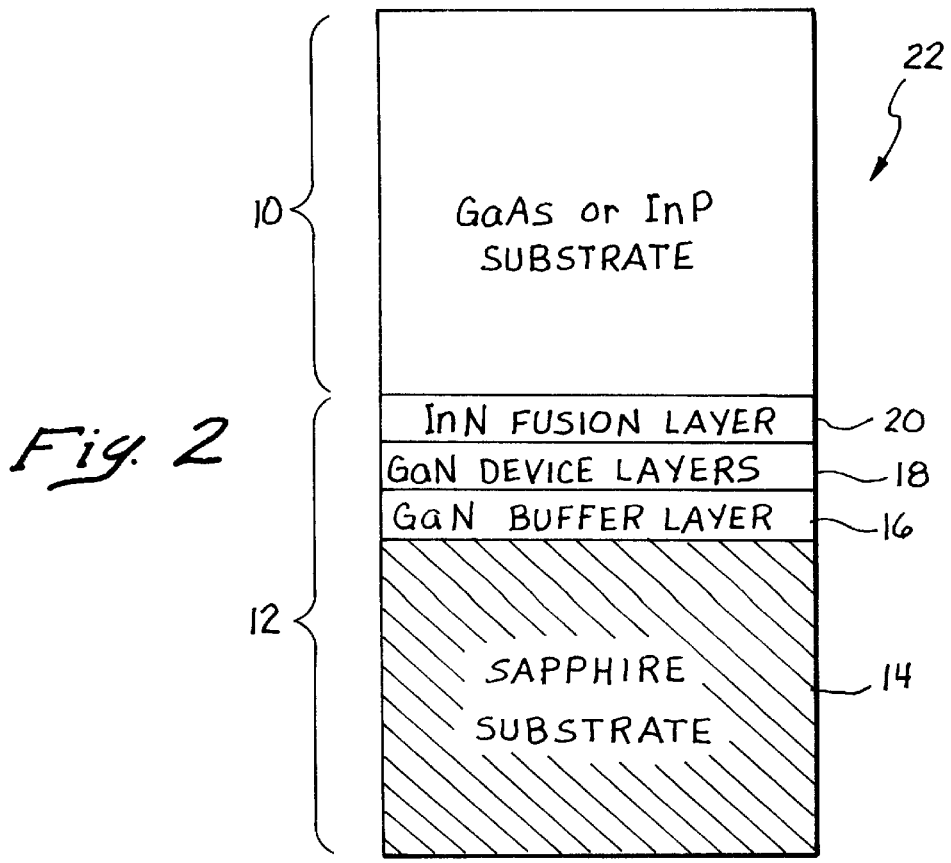
FIG. 2 is a simplified diagram of the product achieved after the thermal fusion process of FIG. 1 is performed.
Figure 3:
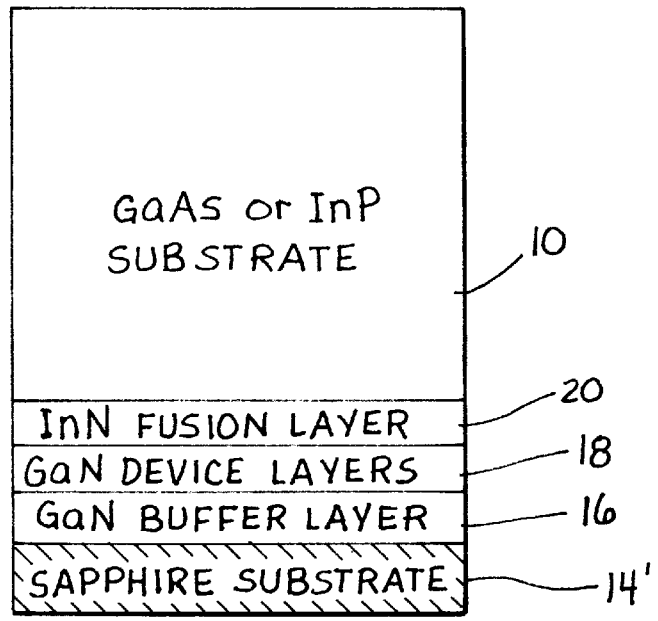
FIG. 3 is a simplified diagram of the product of FIG. 2 after removal of most of the sapphire substrate by lapping or dry etching.
Figure 4B:
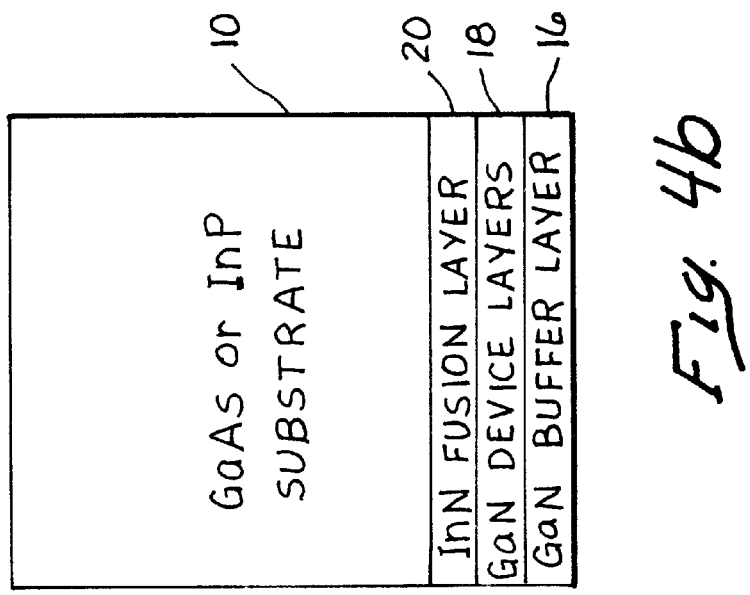
FIG. 4b is a simplified diagram of the product of FIG. 4a after removal of the sapphire substrate by the etching of a sacrificial layer.

In the case where lapping or dry etching occurs, the resulting structure is shown in FIG. 3 wherein sapphire substrate 14 has been reduced to a thinner sapphire layer 14' which is still fused to buffer layer 16. Alternatively, in the case of substrate removal using a wet etch, a sacrificial ZnO layer 24 is first disposed on sapphire substrate 14 between substrate 14 and buffer layer 16 and then the two structures 10 and 12 fused as described above in connection with FIG. 2 to obtain the overall structure shown in FIG. 4a. Thereafter, sapphire substrate 14 is removed by the wet etch removal of sacrificial layer 24 leaving the fused structure comprised of substrate 10, device layer 18 and buffer layer 16 shown in FIG. 4b.

Figure 4A:
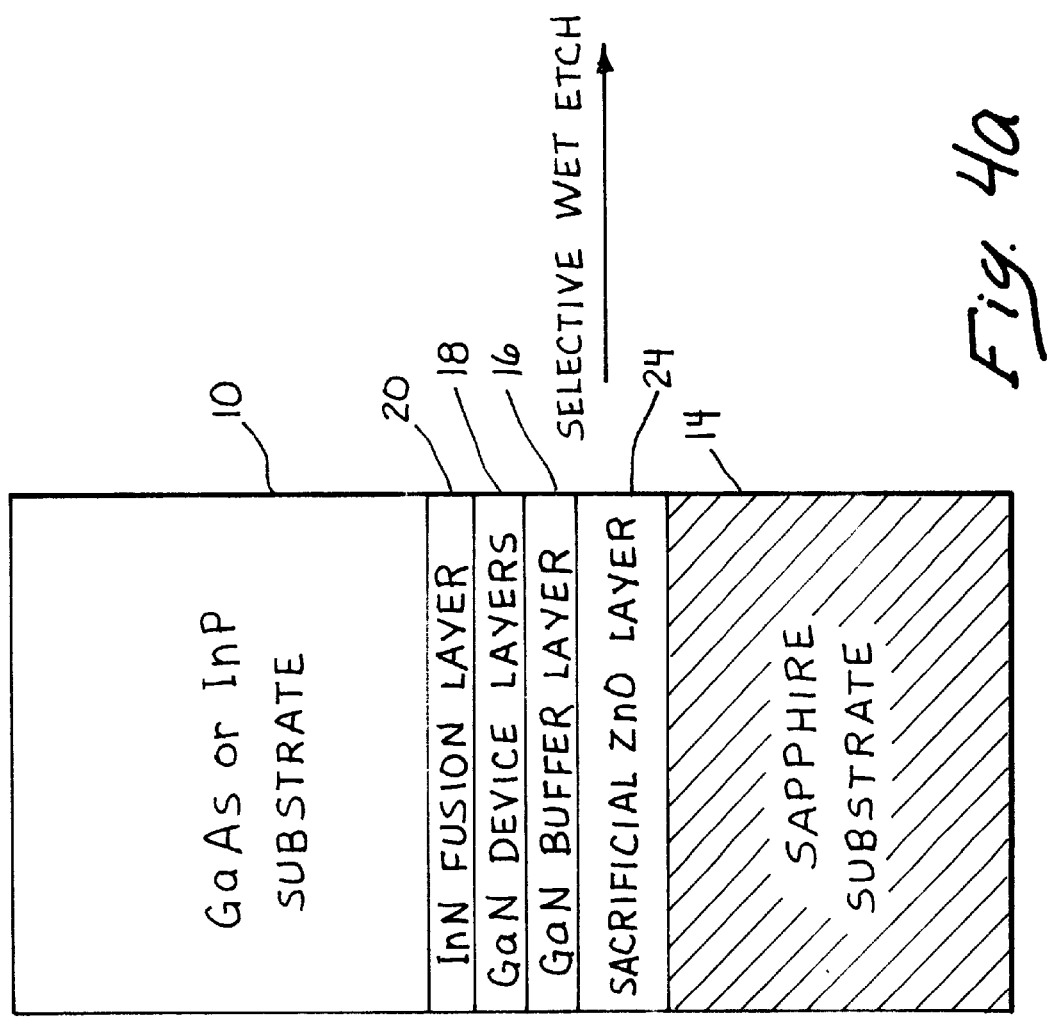
FIG. 4a is a simplified diagram of the product of FIG. 2 in which a sacrificial layer has been included to allow for the removal of the sapphire substrate by the etching of the sacrificial layer.

In any case, after the fabrication of the intermediate product shown in either FIGS. 3 or 4a,b, GaAs or InP substrate 10 is then cleaved in a conventional manner resulting in a (110) cleaved mirror plane in GaAs or InP substrate 10, which substantially or completely propagates into and through GaN device layer 18, and GaN buffer layer 16 which were epitaxially grown on hexagonal sapphire substrate 14 which does not have cubic symmetry.

The general wafer fusion and cleaving method now having been described, consider a specific example. GaN buffer layer 16 and GaN device layer 18 were grown at atmospheric pressure by metal organic chemical vapor deposition (MOCVD) using trimethyl gallium, TMGa, and ammonia ($NH_3$) sources in a Thomas Swan Limited reactor. A 19 nm GaN nucleation layer 16 was grown approximately at 600° C. on a basal plane sapphire substrate before growing a thicker GaN film or layer 18 at approximately 1,080° C. In the illustrated embodiment, the GaN film thickness in various samples was prepared with a thickness varying from 1.5 to 2.5 microns with a root mean square surface roughness of approximately 1 nm as measured by atomic force microscopy. The details of this growth process are generally known and a description can be found in B. P. Keller et al., Electronics Letters 31,1102(1995). InP substrate 10 was (100) n-type substrate with no epitaxially grown layers formed on it.

InP substrate 10 and sapphire base structure 12, each of which were approximately 8×8 $mm^2$ were cleaned with solvents. Channels ten microns wide with a period of 150 microns were etched into InP substrate 10 in order to allow gas and liquid to escape from the interface with sapphire base structure 12 formed during the fusion process. Oxide layers from substrates 10 and 12 were removed with a 49% hydrofluoric solution by volume. Before the hydrofluoride solution evaporated from the surfaces of substrates 10 and 12, the substrates were pressed together by a graphite fixture with a force of 5 MPa and were heated to approximately 750° C. for approximately 60 minutes.

This temperature allows for the active mass transport of indium at the InP/GaN interface. The mass transport is believed to effectively level the surface of the moderately rough GaN to allow better matching of their mating surfaces. The quality of fusion can be quality checked by cross-section transmission electron microscopy. According to the methodology described, the InP/GaN fused interface is free of voids and has no oxide layer indicating that structures 10 and 12 are well fused. In addition, defects formed by the fusion process are contained within a few monolayers of the fused interface, which is indicative of the preservation of the structural integrity of both structures 10 and 12 during the fusion process.

After fusion as depicted in FIG. 2, sapphire substrate 14 was lapped using a diamond slurry with 15 micron grit to make it thin enough for cleaving, namely less than 150 microns thick. It is believed that the thinning helps to propagate the (110) direction cleave through the epitaxial layers, which might otherwise be more difficult if the sapphire layer was left thicker. By making a scribe mark on InP substrate 10, turning the fuse samples over and pressing on sapphire substrate 14, GaN layer 16 and thinned sapphire layer 14' are forced to cleave parallel to the (110) crystal planes of InP substrate 10.

Again, a scanning electron microscope micrograph of the cleaved facet provides a quality control check that shows that the interface is free of voids and well fused. Facets produced in the this manner appear to optically flat when examined by bright field, dark field and Nomarsky interference contrast microscopy and when examined by scanning electron microscopy. A Dektak measurement across facet also indicated that the surface has either a small or even no step at the interface between the GaN layer 16 and 18 and InP substrate 10.

Figure 5:
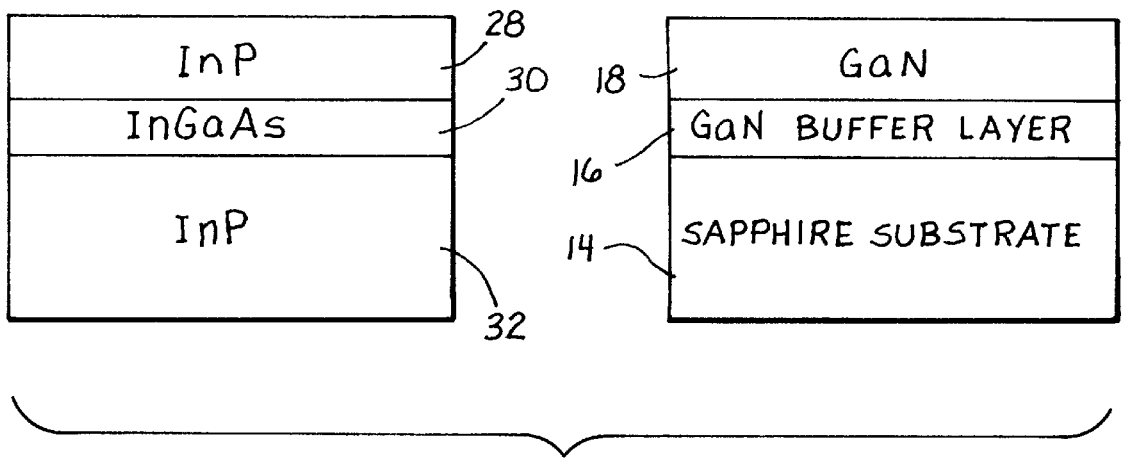
FIG. 5 is a simplified diagram illustrating the starting components for a thermal fusion process fusing GaN on sapphire to a GaAs or InP substrate in which the contact resistance to GaN is measured.
Figure 6:
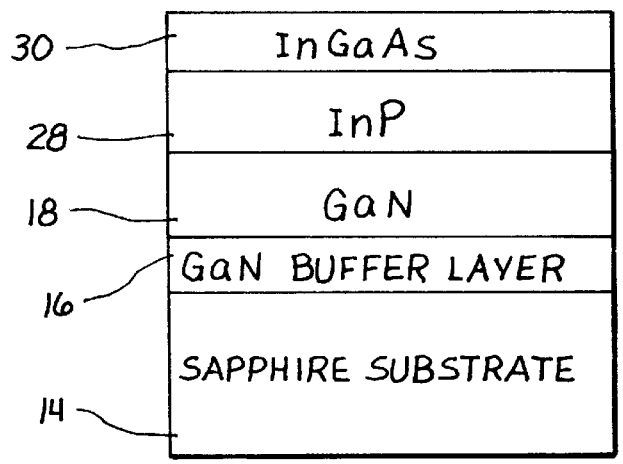
FIG. 6 is the fused product resulting from the starting components of FIG. 5.
Figure 7:
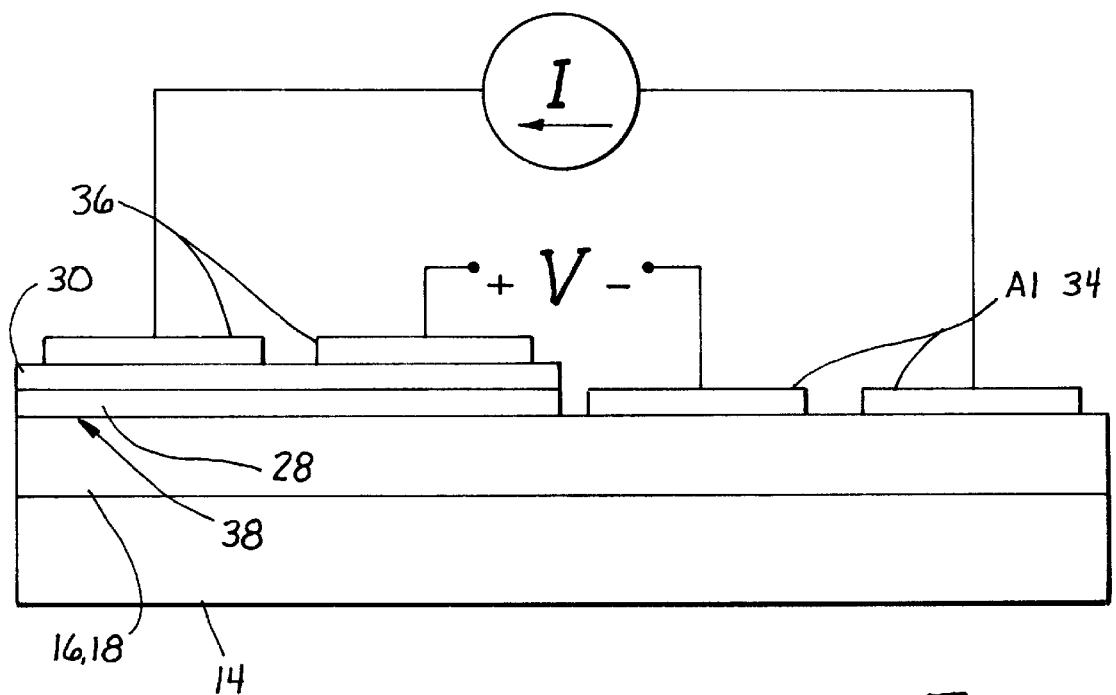
FIG. 7 is a test electronic circuit made from the composite of FIG. 5.

Many different kinds of optoelectronic devices may be fabricated using this technology, including lasers, photodetectors, modulators, heterojunction bipolar transistor and other transition technologies. Current injection across the fused interface is critically important in most of these devices. To measure the electrical characteristic of the junction, InP substrate 10 shown in the embodiments of FIGS. 1–4 was replaced by an epitaxially grown structure 26 shown in FIG. 5, comprised of an InP layer 28 approximately 500 nm thick, an InGaAs layer 30 approximately 200 nm thick, followed by an InP substrate layer 32. Layers 28, 30 and 32 were n-doped with silicon in the range of $10^{18}/cm^3$ to $10^{19}/cm^3$. Structures 12 and 26 as shown in FIG. 5 were then fused in the same manner as described above in connection with the embodiment of FIGS. 1–4. After fusion, InP layer 32 was etched away as shown in FIG. 6, stopping at InGaAs layer 30 as an etch stop layer. Selected areas of the InGaAs and InP epitaxial layers 30 and 28 were then etched away to allow for contact to epitaxial layer 18 as best depicted in FIG. 7. Aluminum contacts 34 were then evaporated onto GaAs layer 16 and 18 and annealed at approximately 500° C. This was followed by evaporation of Au/Ni/AuGe/Ni sandwich contacts 36 to n-doped InGaAs layer 30 followed by a second annealing at 430° C. For the contact of InP layer 28 and metal contact layer 36, the first nickel barrier layer was designed to prevent diffusion of germanium to the fusion junction thereby preserving the electrical characteristics of the fusion junction 38. Similar contact structures could of course be substituted where diffusion presented no problem.

Figure 8:
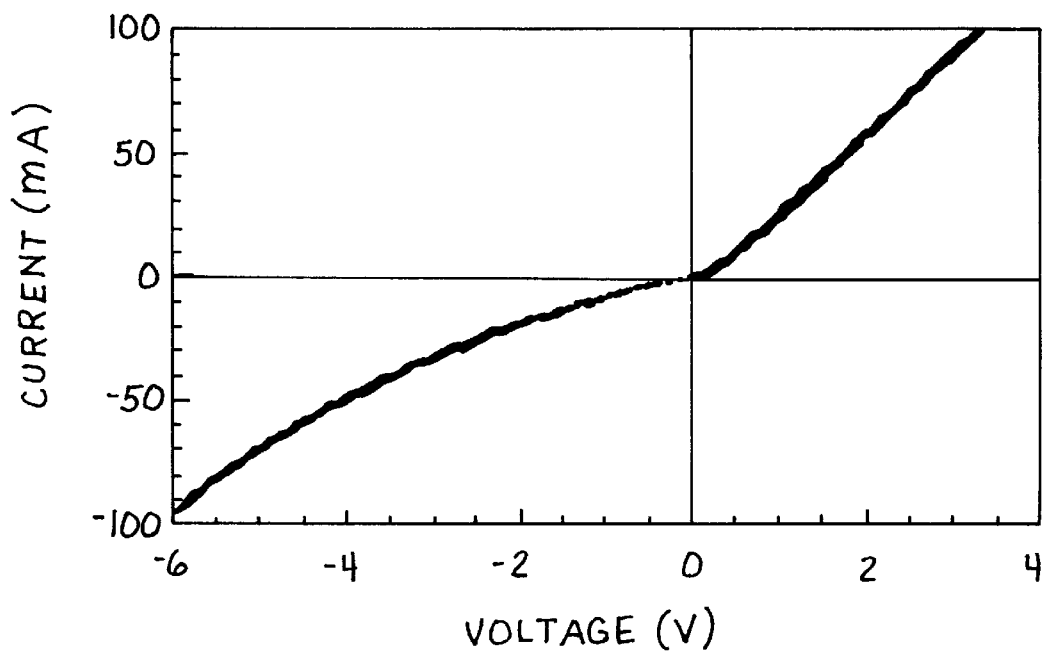
FIG. 8 is a graph of the current-voltage characteristics of the GaN contact pad of FIG. 7.

The electrical characteristics of fusion interface 38 were then measured using the four point probe as shown in FIG. 7, which was designed to reduce the effects of contact resistance. Pads 34 and 36 were normally 200 microns wide in a direction perpendicular to the current flow and 170 microns long and spaced apart by 20 microns. Resistance along this 20 micron separation was not subtracted from the electrical measurements. FIG. 8 shows the current-voltage characteristics of interface 38 in a graph with current depicted on the vertical axis and voltage depicted on the horizontal axis. Electrons moving from GaN layers 16, and 18 into InP layers 28 and 30, the region of negative voltage, encounter almost no detectable barrier. Electrons moving in the opposite direction, the region of positive voltage, from InP layer 28 and 30 to GaN layer 16 and 18 encounter a potential barrier of several electron volts. This barrier can be eliminated by growing an intermediate graded bandgap layer.

The sandwich epitaxial layer described in connection with FIGS. 6 and 7 provides a good measure for fusion uniformity. After etch removal of InP substrate 28, only a thin layer of epitaxial InP/InGaAs remained. In areas that were not well fused, this thin layer cracked and broke away. After etching the substrate, the proportion of the sample area that was well fused was therefore easily determinable. For a typical processing run, fusion was achieved in 60 to 70 percent of the sample area with lack of fusion in the remainder of the area attributed to increased surface roughness of the GaN in those areas. An InGaN sample with an indium mole fraction of 10 to 20 percent were fused to InP with the expectation that extra indium would facilitate mass transport at the interface. The proportion of area fused, however, was not noticeably improved over GaN samples. At these mole fractions, the content of indium in InGaN is too low to compensate for increased roughness of the InGaN samples over the GaN samples.

In summary therefore, optically flat, cleaved GaN facets can be fabricated using wafer fusion of GaN to InP. There are no indications of voids or oxide formation indicating that the interfaces were well fused. In addition, current injection has been demonstrated across the fused interface at low voltages. The method thereby provides a viable means for the fabrication of GaN in-plane lasers. Fusion uniformity is expected to increase to the acceptable yield levels with the creation of smoother GaN epitaxial layers.

Figure 9:
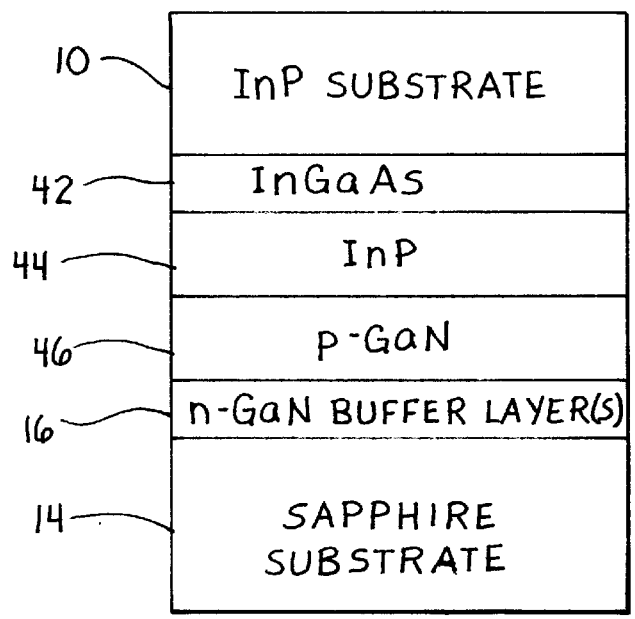
FIG. 9 is another embodiment of the fused product.

A second application of the invention is in the fabrication of low resistance p-type contacts to GaN. Turn now to the problem of reducing the resistance of p-type contacts to GaN. One possible material choice as depicted in FIG. 9 is epitaxial p-InP/p-InGaAs layers 44 and 42 respectively grown on an InP substrate 10. This is then fused to p-GaN layer 46 grown on sapphire substrate 14 by means of an interlying n-GaN buffer layer 16 in the manner described above. In this case, p-InP layer 44 serves as a fusion layer to p-GaN layer 46. InP substrate 10 can then be removed by wet etching in order to make contact to p-InGaAs layer 42. Making metal contacts on p-InGaAs layer 42 is relatively easy and produces low contact resistances including in particular hole conduction.

The methodology is not limited to p-InP/p-InGaAs layers, but can be extended to other systems such as p-GaAs/p-AlGaAs layers. Also the p-InP fusion layer 44 may be eliminated if desired, where the p-InGaAs layer 42 acts as both the fusion layer and contact layer in the device.

Figure 10:
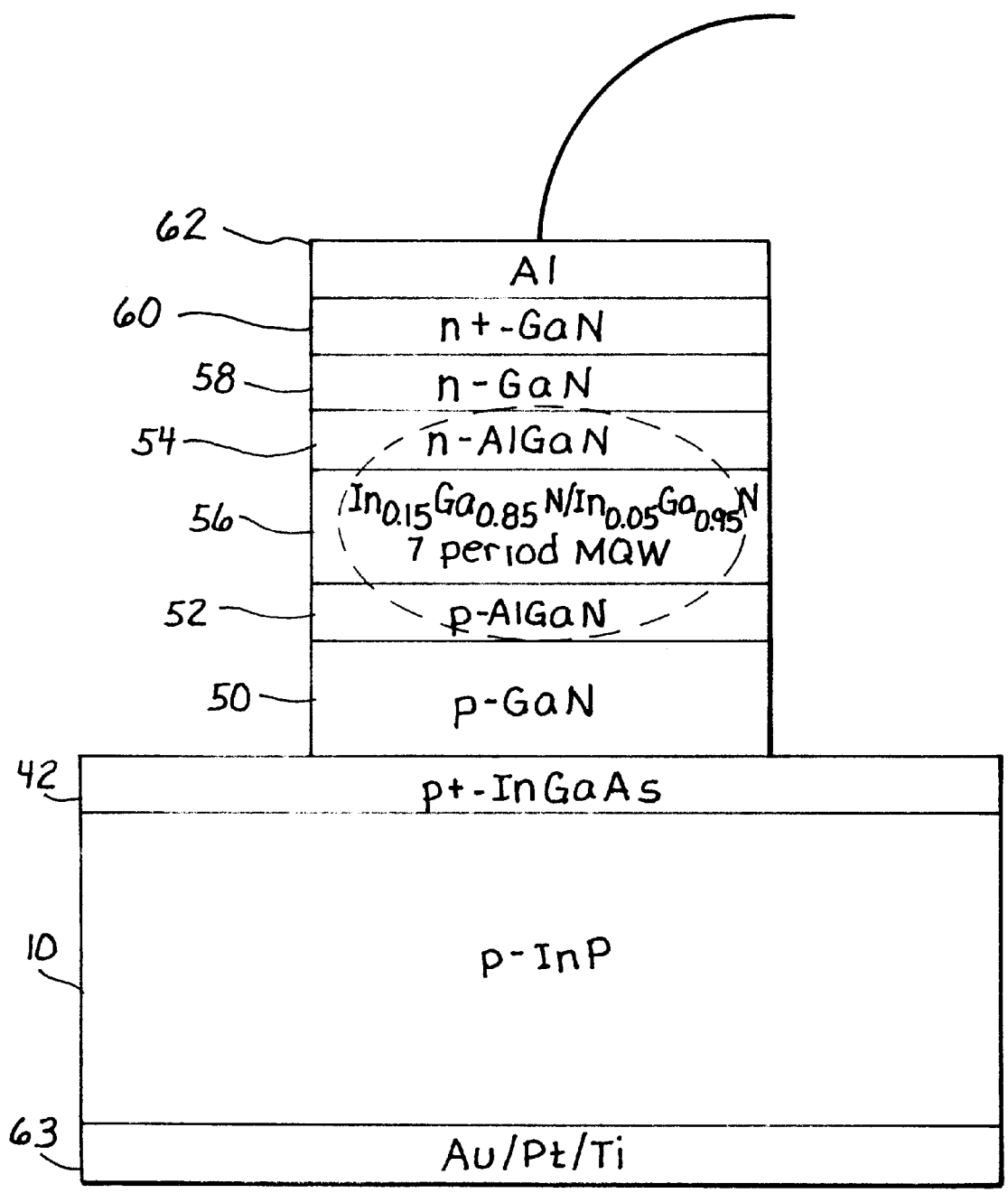
FIG. 10 is a photonic circuit made from starting components of FIG. 5.

FIG. 10 depicts a diagrammatic cross-sectional view of a completed photonic device made according to the invention. A p-InP substrate 10 is provided with a p+-InGaAs layer 42 as described in connection with FIG. 9. A p-InGaN fusion layer 50 is disposed on p-AlGaN device layer 52. A multiple quantum well (MQW) structure composed of $In_{0.15}Ga_{0.85}N$ wells and $In_{0.05}Ga_{0.95}N$ barriers is disposed between an n-AlGaN layer 54 and p-AlGaN layer 52. This multiple quantum well structure is denoted as layer 56 in FIG. 10. An n-GaN layer 58 is disposed between an n+-GaN layer 60 and an n-AlGaN layer 54. Electrical contact for n-type charge carriers is then made to the quantum well through n+-GaN layer 60 to aluminum contact pad 62. This contact will be annealed at 500° C. Electrical contact for p-type charge carriers is then made to the MQW through the p-InP substrate 10 to Au/Pt/Ti contact pad 63. This contact will be annealed at 400° C.

The purpose of the layers of FIG. 10 are consistent with those of conventional semiconductor laser technology. N+-GaN layer 60 functions as a contact layer to provide low resistance to electron current in the underlying n-GaN layer 58. The optical mode (photons) is confined through the use of a material with a lower index of refraction than that of the active region. In this manner, n-GaN layer 58 and p-GaN layer 52 provide photon confinement, i.e. the waveguide for the optical mode. Semiconductor materials with a large bandgap energy are used outside of regions with smaller bandgap energies in order to provide a carrier confinement well that forces carriers to recombine inside the active region where they will produce useful light. Thus, n-AlGaN layer 54 and p-AlGaN layer 52 provide carrier confinement for the smaller bandgap InGaN MQW structure denoted as layer 56. The purpose of the p+InGaAs layer 42 is to provide low resistance to hole current in the overlying p-GaN layer 50. P+-InGaAs layer 42 also functions as a fission layer for fusion of p+-InGaAs to p-GaN layer 50. P-InP substrate layer 10 provides a cubic host that permits the fabrication of cleaved facet mirrors as described above.

The third application of fusion is to increase the activation of the p-type dopant in GaN It is known that hydrogen passivates the p-type dopants in Mg doped GaN by neutralizing the vacant bond sites between Mg and N atoms. See, Nakamura. *"Thermal Annealing Effectson P-Type Mg-Doped GaN Films,"* Jpn. J. Appl. Phys. Vol. 31, pp. L139–142 (1992). Heating GaN allows the hydrogen atoms to leave the passivation sites, thus allowing the p-type Mg dopant to become activated. However, above about 750° C. nitrogen begins to leave its site. The nitrogen vacancies formed in this way act a n-type dopants and therefore offset the increased activation of p-type dopants. The trend as temperature is increased above 750° C. is such that the net dopant concentration is reduced. Conventional means of inhibiting the loss of N from the GaN crystal is to anneal in an overpressure of N. This would typically be done by placing another wafer of the same type in physical contact with the wafer to be annealed.

Wafer fusion of the invention provides a better way. The annealing step is simultaneously performed with the fusion step so that there is no additional high temperature step required for fusion. In addition, fusion will allow the wafers to be heated to a higher temperature than with other methods because the fusion layer, such as InP will provide a physical barrier to desorption of the N, while at the same time allowing the smaller H atoms to escape surface. Due to the nitrogen cap, annealing temperatures can be increased and more of the p-type dopant activated.

The fusion layer can also be heavily doped with Zn, Be, Mg or N in order to reduce the number of nitrogen vacancies and to increase the p-type dopant concentration of the p-type GaN layers. A potential problem that may need to be solved is that as the annealing temperature is increased above 850° C., InP becomes extremely soft and P desorbs from the InP at an extremely large rate. Growing the fusion layer in another material system, such as GaAs as the substrate, may be better if annealing temperatures higher than 850° C. are required or if nitrogen is dissolved in the chosen fusion layers. The invention is important for making pn junction devices such as LEDs or diodes. It is important for making transistors and heterojunction bipolar transistors which require a highly doped p-layer.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for fabricating a cleaved facet along a vertical plane in a noncubic material epitaxially grown on a surface of a noncubic substrate, said vertical plane being perpendicular to said surface of said noncubic substrate comprising:

epitaxially growing a noncubic layer on said noncubic substrate;

fusing said epitaxially grown noncubic layer to a second substrate having said vertical plane as a cleavage plane; and cleaving said second substrate along said vertical plane, whereby an optically flat vertical reflecting plane is fabricated in said layer epitaxially grown on said noncubic substrate.

2. The method of claim 1 where epitaxially growing said noncubic layer on said noncubic substrate comprises epitaxially growing a metallic nitride on sapphire.

3. The method of claim 2 where fusing said epitaxially grown noncubic layer to a second substrate comprises fusing a GaAs substrate to an epitaxially grown GaN layer.

4. The method of claim 2 where fusing said cubic substrate to said epitaxially grown layer comprises fusing an InP substrate to said epitaxially grown GaN layer.

5. The method of claim 1 further comprising removing at least part of said noncubic substrate comprises lapping said noncubic substrate to a selected thinness.

6. A method for fabricating a cleaved facet along a vertical plane in a noncubic material epitaxially grown on a surface of a noncubic substrate, said vertical plane being perpendicular to said surface of said noncubic substrate, comprising:

epitaxially growing a noncubic layer on said noncubic substrate;

fusing said epitaxially grown noncubic layer to a second substrate which has said vertical plane as a cleavage plane; and cleaving said second substrate along said vertical plane, removing at least part of said noncubic substrate by etching away said noncubic substrate, whereby an optically flat vertical reflecting plane is fabricated in said layer epitaxially grown on said noncubic substrate.

7. A method for fabricating a cleaved facet along a vertical plane in a noncubic material epitaxially grown on a surface of a noncubic substrate, said vertical plane being perpendicular to said surface of said noncubic substrate, comprising;

epitaxially growing a noncubic layer on said noncubic substrate;

fusing said epitaxially grown noncubic layer to a second substrate which has said vertical plane as a cleavage plane; and cleaving said second substrate along said vertical plane, disposing a sacrificial layer on said noncubic substrate prior to epitaxially growing said layer thereon and further comprising removing at least part of said noncubic substrate by wet etching away said sacrificial layer, whereby an optically flat vertical reflecting plane is fabricated in said layer epitaxially grown on said noncubic substrate.

8. The method of claim 1 wherein Expitaxially growing said layer on said noncubic substrate comprises first epitaxially growing a buffer layer on said noncubic substrate and then epitaxially growing a device layer on said noncubic substrate.

9. The method of claim 8 where epitaxially growing said buffer device layer comprises epitaxially growing a GaN buffer and device layers on a sapphire substrate.

10. A method for fabricating a cleaved facet along a vertical plane in a noncubic material epitaxially grown on a surface of a noncubic substrate, said vertical plane being perpendicular to said surface of said noncubic substrate, comprising:

epitaxially growing a noncubic layer on said noncubic substrate;

fusing said epitaxially grown noncubic layer to a second substrate which has said vertical lane as a cleavage lane; and cleaving said second substrate along a vertical plane; and wherein Expitaxially growing said layer on said noncubic substrate comprises first epitaxially growing a buffer layer on said noncubic substrate and then epitaxially growing a device layer on said noncubic substrate, epitaxially growing a fusion layer on said device layer, whereby an optically flat vertical reflecting plane is fabricated in said layer epitaxially grown on said noncubic substrate.

11. The method of claim 10 wherein epitaxially growing said fusion layer comprises epitaxially growing an $In_2Ga_{1-}$ xN fusion layer on said device layer, where x is a number between 0 and 1 inclusive.

12. A method for fabricating a cleaved facet along a vertical plane in a noncubic material epitaxially grown on a surface of a noncubic substrate, said vertical plane being perpendicular to said surface of said noncubic substrate, comprising:

epitaxially growing a noncubic layer on said noncubic substrate;

fusing said epitaxially grown noncubic layer to a second substrate which has said vertical plane as a cleavage plane; and cleaving said second substrate along said vertical plane; and wherein Expitaxially growing said layer on said noncubic substrate comprises first epitaxially growing a buffer layer on said noncubic substrate and then epitaxially growing a device layer on said noncubic substrate, where epitaxially growing said buffer device layer comprises epitaxially growing a GaN buffer and device layers on a sapphire substrate and further comprises epitaxially growing a fusion layer on said device layer, whereby an optically flat vertical reflecting plane is fabricated in said layer epitaxially grown on said noncubic substrate.

13. The method of claim 12 wherein epitaxially growing said fusion layer comprises epitaxially growing an $In_xN_{1-x}$ fusion layer on said device layer, where x is a number between 0 and 1 inclusive.

14. An improvement in a method for fabricating mirror facets in a photonic device comprising:

epitaxially growing an active device layer on a surface of a noncubic substrate;

wafer fusing said epitaxially grown active device layer to an oriented substrate to provide a fused structure, said oriented substrate having a vertical cleavage plane perpendicular to said surface of said noncubic substrate; and cleaving said fused structure to obtain a cleaved vertical plane through said fused structure, whereby an optically flat mirror surface for said photonic device is obtained.

15. The improvement of claim 14 where wafer fusing said epitaxially grown active device layer to said oriented substrate wafer fuses said active device layer to a GaAs substrate.

16. The improvement of claim 14 where wafer fusing said epitaxially grown active device layer to said oriented substrate fuses said active device layer to an InP substrate.

17. The improvement of claim 14 where epitaxially growing said active device layer on said noncubic substrate comprises epitaxially growing a GaN layer on said substrate.

18. An improvement in a method for fabricating mirror facets in a photonic device comprising:

epitaxially growing an active device layer on a surface of a noncubic substrate;

wafer fusing said epitaxially grown active device layer to an oriented substrate to provide a fused structure, said oriented substrate having a vertical cleavage plane perpendicular to said surface of said noncubic substrate; and cleaving said fused structure to obtain a cleaved vertical plane through said fused structure, where epitaxially growing said active device layer on said noncubic substrate comprises epitaxially growing a $In_xGa_{1-x}N/In_yGa_{1-y}N$ multiple quantum well layer on said substrate, where x and y are each numbers between 0 and 1 inclusive, whereby an optically flat mirror surface for said photonic device is obtained.

19. The improvement of claim 14 further comprising removing at least a portion of said sapphire substrate comprises thinning said sapphire substrate prior to cleaving said fused structure to reduce influence of sapphire bond strength on said cleaved facet.

20. An improvement in a method for fabricating mirror facets in a photonic device comprising:

epitaxially growing an active device layer on a surface of a noncubic substrate;

wafer fusing said epitaxially grown active device layer to an oriented substrate to provide a fused structure, said oriented substrate having a cleavage plane perpendicular to said surface of said noncubic substrate; and cleaving said fused structure to obtain a vertical cleaved plane through said fused structure, where epitaxially growing said active device layer on said sapphire substrate comprises first epitaxially growing a nucleation layer at a first temperature and thereafter growing a thicker active device layer at a second higher temperature, whereby an optically flat mirror surface for said photonic device is obtained.

21. An improvement in a method for fabricating mirror facets in a photonic device comprising:

epitaxially growing an active device layer on a surface of a noncubic substrate;

wafer fusing said epitaxially grown active device layer to an oriented substrate to provide a fused structure, said oriented substrate having a vertical cleavage plane perpendicular to said surface of said noncubic substrate; and cleaving said fused structure to obtain a a vertical cleaved plane through said fused structure, defining a plurality of channels in said oriented substrate prior to fusing to permit fluid escape from an interface defined in said fused structure between said active device layer and said oriented substrate during fusing of said active device layer and oriented substrate, whereby an optically flat mirror surface for said photonic device is obtained.

22. A method for fabricating a p-type electrical contact on a layer of metallic nitride comprising:

disposing said metallic nitride layer on a first substrate;

disposing a p-type fusion layer on a second substrate;

fusing said metallic nitride to said p-type fusion layer on said second substrate;

removing at least part of said second substrate to form an opening for an electrical contact to said metallic nitride layer; and forming an electrical contact in said opening, whereby a reduced resistance contact is provided to said metallic nitride layer.

23. The method of claim 22 where disposing said metallic nitride layer on a first substrate comprises epitaxially growing said metallic nitride layer on said first substrate.

24. The method of claim 23 where epitaxially growing said metallic nitride layer on said first substrate comprises epitaxially growing p-type GaN on a sapphire substrate.

25. The method of claim 22 where disposing a p-type fusion layer on a second substrate comprises disposing a p-type InGaAs layer on an InP substrate.

26. The method of claim 25 where disposing a p-type InGaAs layer on an InP substrate further comprises disposing a p-type InP fusion layer between said p-type InGaAs layer and said p-type GaN layer.

27. The method of claim 22 where disposing a p-type fusion layer on a second substrate comprises disposing a p-type AlGaAs fusion layer on said second substrate, and where disposing said metallic nitride layer on a first substrate comprises disposing a p-type GaN layer on said first substrate.

28. A method for activating a p-type dopant in a metallic nitride layer comprising:

disposing a p-type doped metallic nitride layer on a first substrate;

disposing a fusion layer on a second substrate;

fusing said p-type doped metallic nitride layer to said fusion layer on said second substrate; and simultaneously annealing said p-type doped metallic nitride layer while fusing said p-type doped metallic nitride layer to said fusion on said second substrate to inhibit loss of nitrogen from said p-type doped metallic nitride layer while activating a p-type dopant in said p-type doped metallic nitride layer, whereby an increase in p-type dopant activation is provided to said metallic nitride layer.

29. The method of claim 28 where disposing a fusion layer on a second substrate comprises disposing a p-type doped fusion layer.

30. The method of claim 29 where disposing a p-type doped metallic nitride layer on a first substrate comprises disposing p-type doped GaN, and where disposing a fusion layer on a second substrate comprises disposing p-type doped InP.

31. The method of claim 29 where disposing a p-type doped metallic nitride layer on a first substrate comprises disposing p-type doped GaN, and where disposing a fusion layer on a second substrate comprises disposing p-type doped GaAs on a GaAs substrate.

* * * * *